(12) United States Patent
Matsuhisa

(10) Patent No.: US 7,102,268 B2
(45) Date of Patent: Sep. 5, 2006

(54) MICROMACHINE AND METHOD OF FABRICATING THE SAME

(75) Inventor: Kazuhiro Matsuhisa, Kanagawa (JP)

(73) Assignee: Sony Corporation, Tokyo (JP)

( * ) Notice: Subject to any disclaimer, the term of this patent is extended or adjusted under 35 U.S.C. 154(b) by 70 days.

(21) Appl. No.: 10/835,769

(22) Filed: Apr. 30, 2004

(65) Prior Publication Data

US 2004/0251793 A1    Dec. 16, 2004

(30) Foreign Application Priority Data

May 13, 2003    (JP)    ............................ P2003-133929

(51) Int. Cl.
*H02N 1/00*    (2006.01)
(52) U.S. Cl. .................................................... 310/309
(58) Field of Classification Search ................ 310/365, 310/309
See application file for complete search history.

(56) References Cited

U.S. PATENT DOCUMENTS 6,677,695 B1 *    1/2004    Dhuler et al. ................ 310/309

6,898,972 B1 *    5/2005    Bauer et al. ............. 73/504.12
6,943,419 B1 *    9/2005    Wong et al. ................ 257/416
2003/0001453 A1 *    1/2003    Shimanouchi .............. 310/309

FOREIGN PATENT DOCUMENTS

WO    WO02014787 A    *    2/2002

OTHER PUBLICATIONS

Nguyen, MP 4.7 "Tunable, Switchable, High-Q-VHF Microelectromechanical Band Pass filters", 1999 IEEE International Solid-State Circuit Conference, pp. 78-79.*

* cited by examiner

*Primary Examiner*—Thomas M. Dougherty
(74) *Attorney, Agent, or Firm*—Sonnenschein Nath & Rosenthal LLP

(57) ABSTRACT

A micromachine successfully reduced in parasitic capacity between input and output electrodes, and having an oscillator configured as ensuring a high S/N ratio under operation at higher frequencies is disclosed. The micromachine comprises an insulating layer formed on a substrate; a first electrode for signal input formed on the insulating layer; a second electrode for signal output formed on the insulating layer; and an oscillator electrode formed as being opposed with the first electrode and the second electrode and as being spaced therefrom by an air gap, wherein the insulating layer has a groove formed therein at least between the first electrode and the second electrode.

3 Claims, 6 Drawing Sheets

MICROMACHINE AND METHOD OF FABRICATING THE SAME

CROSS REFERENCES TO RELATED APPLICATIONS

The present document is based on Japanese Priority Document JP 2003-133929, filed in the Japanese Patent Office on May 13, 2003, the entire contents of which being incorporated herein by reference.

BACKGROUND OF THE INVENTION

1. Field of the Invention

The present invention relates to a micromachine and a method of fabricating the same, and in more detail, a micromachine having a frequency selection function and can be integrated with a semiconductor device, and a method of fabricating the same.

2. Description of Related Art

A micro-resonator fabricated based on a semiconductor process is characterized by its small device occupational area, capability of realizing a high Quality-factor, and possibility of integration with other semiconductor devices, and its use as an IF filter and an RF filter, out of various wireless communication devices, has been proposed by several research institutes including Michigan University (see non-patent document 1, for example).

The micro-resonator ever proposed and examined, however, has a resonance frequency only as high as not exceeding 200 MHz at maximum, and has been unsuccessful in providing its characteristic Quality-factor in a frequency range in GHz band, unlikely to a conventional gigahertz (GHz) filter based on surface acoustic wave (SAW) or a film bulk acoustic resonator (FBAR). At present, there is a general tendency of lowering in a peak of resonance frequency as an output signal in higher frequencies, so that improvement in signal-to-noise (S/N) ratio of the peak of resonance frequency is essential for obtaining a desirable filter characteristic.

According to a disk type micro-resonator described in non-patent document 1, a noise component in an output signal is ascribable to a signal which directly transmits a parasitic capacitance formed between the input and output electrodes, and it is described that the noise component can be reduced by disposing an oscillator electrode applied with direct current (DC) between input and output electrodes. On the other hand, a DC voltage exceeding 30 V will be necessary for the disk type oscillator to obtain a sufficiently large output, and a preferable example of a practical configuration will be such as having a beam structure using a Clamp-Clamp beam. One typical beam structure applied with the above-described noise component reduction method will have an electrode arrangement as shown in FIG. 6. In FIG. 6, a stacked film 114 composed of a silicon oxide film 112 and a silicon nitride film 113 is formed on a silicon substrate 111, an input electrode 115 and an output electrode 116 are formed thereon in parallel as being spaced from each other, and further thereon a beam resonator 117 is disposed across the input electrode 115 and the output electrode 116, while being spaced by a micro air gap.

[Non-Patent Document 1]

Clark T. -C. Nguyen, Ark-Chew Wong, Hao Ding, "MP4.7 Tunable, Switchable, High-Q VHF Microelectromechanical Band Pass Filters", 1999 IEEE International Solid-State Circuit Conference, P.78–79

Arrangement of the input electrode and the output electrode shown in FIG. 2, however, still suffers from parasitic capacitances C1, C2, as shown in FIG. 7, which reside between the input electrode 115 and the output electrode 116 in a space therebetween or through the underlying layer (stacked layer 114). In particular for an oscillator of a gigahertz design, S/N ratio will generally degrade due to shrinkage of the structure and narrowing of the distance between the input and output electrodes. This demands further reduction in the parasitic capacitance between the input and output electrodes. The present invention is therefore to provide a micromachine having a reduced parasitic capacitance between the input and output electrodes, and ensuring a large S/N ratio even under operation in higher frequencies.

SUMMARY OF THE INVENTION

The present invention relates to a micromachine and a method of fabricating the same, accomplished in view of solving the above-described problems.

A micromachine of the present invention comprises an insulating layer formed on a substrate; a first electrode for signal input (high-frequency signal input, for example) formed on the insulating layer; a second electrode for signal output (high-frequency signal output, for example) formed on the insulating layer; and an oscillator electrode formed as being opposed with the first electrode and the second electrode while being spaced therefrom by an air gap, wherein the insulating layer has a groove formed therein at least between the first electrode and the second electrode.

Because the groove is formed in the insulating layer, which possibly configures a region having a large dielectric constant, at least between the first electrode and second electrode as the input/output electrodes, thus-configured micromachine is successful in reducing the capacitance between the first electrode and second electrode, in reducing noise component caused by a signal directly transmits between the first electrode and second electrode, and consequently in obtaining a large S/N ratio even under high-frequency operation. Generally, capacitance between the electrodes is mainly classified into that created while placing an air space in between, and that created while placing the underlying insulating layer in between. The present invention is to reduce the overall capacitance by forming the groove in the insulating layer in a portion between the first electrode and second electrode. The micromachine of the present invention can realize a higher S/N ratio and can more readily detect a signal at higher frequencies as compared with a micromachine having the same configuration of the oscillator electrode, first electrode and second electrode but having no groove between the first and second electrodes.

A method of fabricating a micromachine of the present invention comprises the steps of forming an insulating layer on a substrate and forming a groove in the insulating layer; forming a first sacrificial layer so as to fill the groove; forming a first electrode for signal input (high-frequency signal input, for example) on the insulating layer on one side of the groove, forming a second electrode for signal output (high-frequency signal output, for example) on the insulting layer on the other side of the groove, and further forming wiring portions of an oscillator electrode as being opposed with the groove while placing the first electrode and the second electrode in between, and being spaced from the first electrode and the second electrode; filling a space between the first electrode and the second electrode with a second sacrificial layer; forming a third sacrificial layer on individual surfaces of the first electrode and the second electrode; forming an oscillator electrode electrically connected with the wiring portions as extending over the first electrode and the second electrode while placing the third sacrificial layer thereunder; and removing the first sacrificial layer, the second sacrificial layer and the third sacrificial layer.

Because the groove is formed in the insulating layer, which possibly configures a region having a large dielectric constant, in a portion between the first electrode and second electrode as the input/output electrodes, the method of fabricating a micromachine is successful in reducing the capacitance between the first electrode and second electrode, in reducing noise component caused by a signal directly transmits between the first electrode and second electrode, and consequently in obtaining a large S/N ratio even under high-frequency operation. Generally, capacitance between the electrodes is mainly classified into that created while placing an air space in between, and that created while placing the underlying insulating layer in between. The present invention is to reduce the overall capacitance by forming the groove in the insulating layer in a portion between the first electrode and second electrode. The method of fabricating a micromachine of the present invention can provide a micromachine having a higher S/N ratio and capable of more readily detecting a signal at higher frequencies, as compared with a method of forming the same configuration of the oscillator electrode, first electrode and second electrode but forming no groove between the first and second electrodes.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DETAILED DESCRIPTION OF THE PREFERRED EMBODIMENTS

Figure 1A:
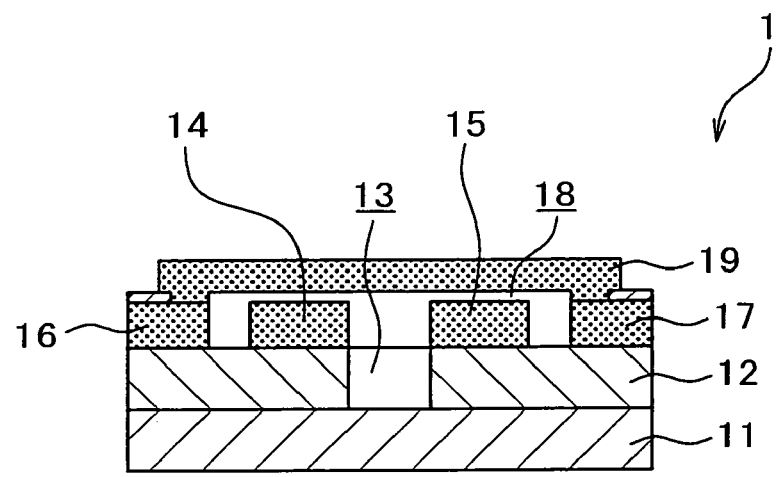
FIGS. 1A and 1B are a schematic sectional view and a plan view, respectively, showing an overall configuration of a micromachine according to a first embodiment of the present invention.

A first embodiment of the micromachine of the present invention will be described referring to FIGS. 1A and 1B. FIG. 1A is a sectional view of the overall configuration, and FIG. 1B is a plan view, where FIG. 1A is a sectional view taken along a line I—I in FIG. 1B.

Figure 1B:
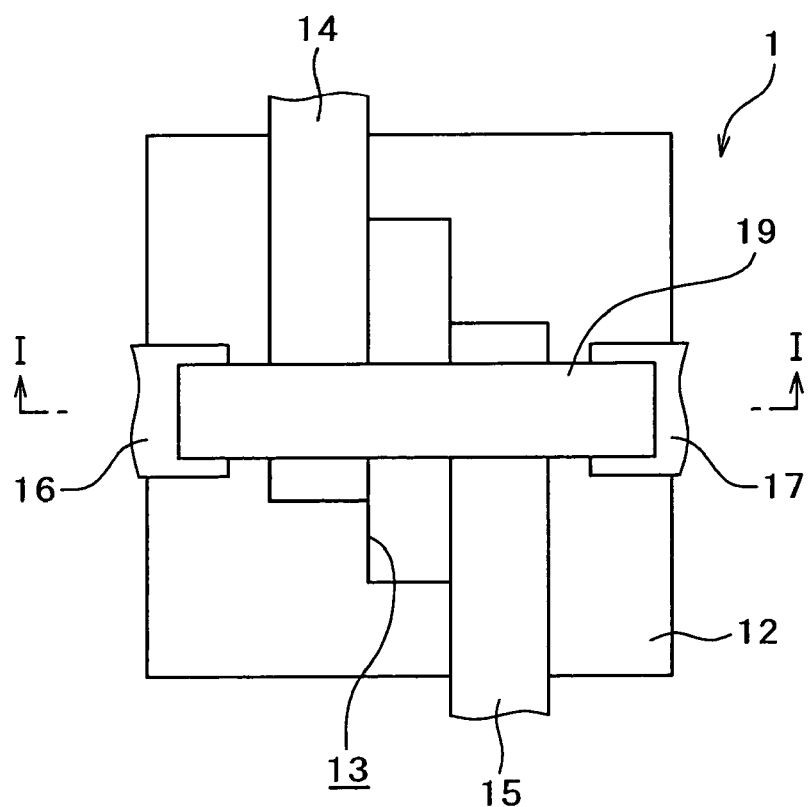

As shown in FIGS. 1A and 1B, an insulating layer 12 is formed on a substrate 11. The substrate 11 is a semiconductor substrate, for which a silicon substrate or compound semiconductor substrate, for example, can be used. The insulating layer herein is formed typically using a silicon nitride film, where it is also allowable to adopt a stacked structure of a silicon oxide film and a silicon nitride film, or a silicon oxide film depending on materials composing sacrificial layers described later with respect to the fabrication method. The insulating layer 12 has a groove 13 formed therein. For a case where the insulating layer 12 is composed of a stacked structure, a surface of the groove 13 is preferably composed of a film same as that composing a surface of the insulating layer 12. This is preferable in view of preventing the groove 13 from unnecessarily be widened in the direction of the insulating layer 12 in a removal process of the sacrificial layers.

A first electrode 14 for signal input (high-frequency signal input, for example) is formed on the insulating layer 12 on one side of the groove 13, and a second electrode 15 for signal output (high-frequency signal output, for example) is formed on the insulating layer 12 on the other side of the groove 13 so as to be spaced from the first electrode 14. On the insulating layer 12, wiring portions 16, 17 of an oscillator electrode are formed as being opposed with the groove 13 while placing the first electrode 14 and the second electrode 15 in between, and while being spaced from the first electrode 14 and the second electrode 15.

Over the first electrode 14 and the second electrode 15, an oscillator electrode 19 connected to the wiring portions 16, 17 is formed while being opposed therewith and being spaced therefrom by an air gap 18. The air gap 18 spacing the first electrode 14 and second electrode 15 from the oscillator electrode 19 is formed to a thickness of 10 nm to 100 nm, for example.

Because the groove 13 is formed in the insulating layer 12 between the first electrode 14 and the second electrode 15, thus-configured micromachine 1 of the first embodiment is successful in reducing the capacitance between the first electrode 14 and the second electrode 15, and consequently in obtaining a large S/N ratio even under high-frequency operation. Generally, capacitance between the electrodes is mainly classified into one created while placing an air space in between, and the other created while placing an underlying insulating layer in between. The present embodiment is to reduce the overall capacitance by forming the groove 13 in the insulating layer 12 in a portion between the first electrode 14 and the second electrode 15. Simulation study by the present inventor has revealed that the configuration of the first embodiment was successful in reducing the capacitance (DC) by as much as 31% as compared with a configuration having no groove 13 formed therein.

Next, operation of the micromachine 1 of the first embodiment will be briefed. In a case where the first electrode (input electrode) 14 is applied with voltage of a predetermined frequency, the oscillator electrode 19 spaced therefrom by the air gap 18 oscillates at a specific oscillation frequency, and a distance between the oscillator electrode 19 and the second electrode (output electrode) 15 formed as being opposed therewith and spaced therefrom by the air gap 18 varies at the specific oscillation frequency. This consequently varies capacitance of a capacitor ascribable to the air gap 18 which spaces the oscillator electrode 19 and the second electrode 15, and a signal of the capacitance is output from the second electrode 15. A high-frequency filter composed of this type of micro-resonator can realize a higher Quality-factor as compared with a high-frequency filter using surface acoustic wave (SAW) or a film bulk acoustic resonator (FBAR).

Figure 2A:
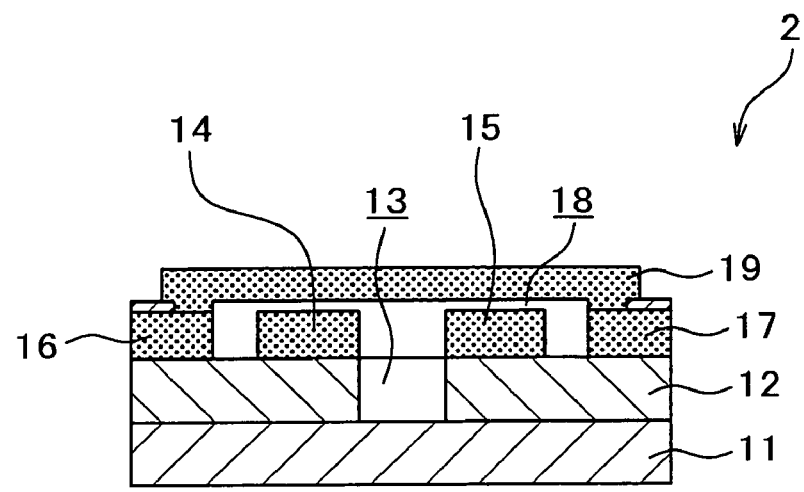
FIGS. 2A and 2B are a schematic sectional view and a plan view, respectively, showing an overall configuration of a micromachine according to a second embodiment of the present invention.

Next, a second embodiment of the micromachine of the present invention will be described referring to FIGS. 2A and 2B. FIG. 2A is a sectional view of the overall configuration, and FIG. 2B is a plan view, where FIG. 2A is a sectional view taken along a line II—II in FIG. 2B.

Figure 2B:
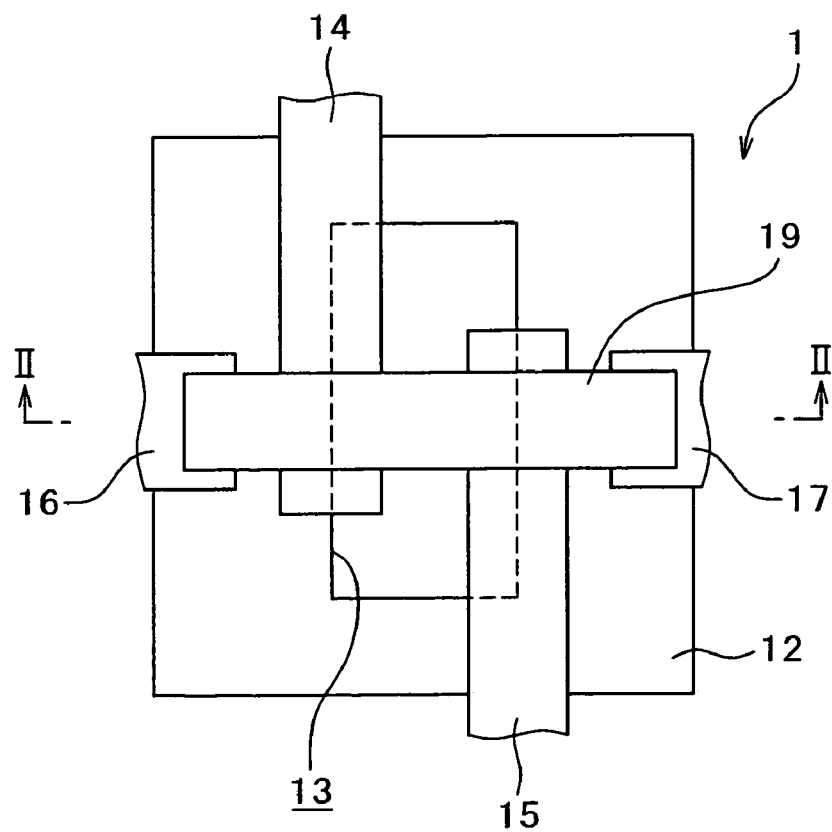

As shown in FIGS. 2A and 2B, the insulating layer 12 is formed on the substrate 11. The substrate 11 is a semiconductor substrate, for which a silicon substrate or a compound semiconductor substrate, for example, can be used. The insulating layer 12 herein is formed typically using a silicon nitride film, where it is also allowable to adopt a stacked structure of a silicon oxide film and a silicon nitride film, or a silicon oxide film depending on materials composing sacrificial layers described later in relation to the fabrication method. The insulating layer 12 has the groove 13 formed therein.

The first electrode 14 for signal input (typically a signal input of a predetermined frequency, such as high-frequency signal input) is formed on the insulating layer 12 on one side of the groove 13, and the second electrode 15 for signal output (typically a signal output of a predetermined frequency, such as high-frequency signal output) is formed on the insulating layer 12 on the other side of the groove 13 so as to be spaced from the first electrode 14. The groove 13 herein is formed so as to get under side edges of the first electrode 14 and the second electrode 15. It is essential that a degree of the getting-under of the groove 13 is not causative of vibration of the second electrode 15 which serves as an output electrode. On the insulating layer 12, the wiring portions 16, 17 of the oscillator electrode are formed as being opposed with the groove 13 while placing the first electrode 14 and the second electrode 15 in between, and while being spaced from the first electrode 14 and the second electrode 15.

The oscillator electrode 19 which is electrically connected with the wiring portions 16, 17 is formed as extending over the first electrode 14 and the second electrode 15, while being opposed therewith and spaced therefrom by the air gap 18. The air gap 18 spacing the first electrode 14 and the second electrode 15 from the oscillator electrode 19 is formed to a thickness of 10 nm to 100 nm, for example.

Because the groove 13 is formed in the insulating layer 12 between the first electrode 14 and the second electrode 15, and because the groove 13 is formed so as to get under the first electrode 14 and the second electrode 15, the micromachine of the second embodiment is more successful in reducing the capacitance between the first electrode 14 and the second electrode 15 as compared with the configuration of the first embodiment, and consequently in obtaining a large S/N ratio even under high-frequency operation.

Operations of the micromachine 2 of the second embodiment are similar to those of the micromachine 1 described in the first embodiment.

Figure 3A:
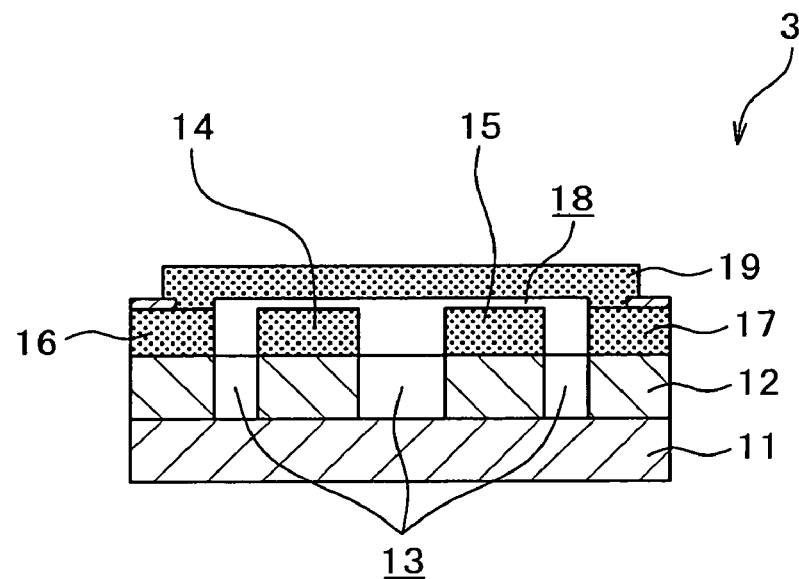
FIGS. 3A and 3B are a schematic sectional view and a plan view, respectively, showing an overall configuration of a micromachine according to a third embodiment of the present invention.

Next, a third embodiment of the micromachine of the present invention will be described referring to FIGS. 3A and 3B. FIG. 3A is a sectional view of the overall configuration, and FIG. 3B is a plan view, where FIG. 3A is a sectional view taken along a line III—III in FIG. 3B.

Figure 3B:
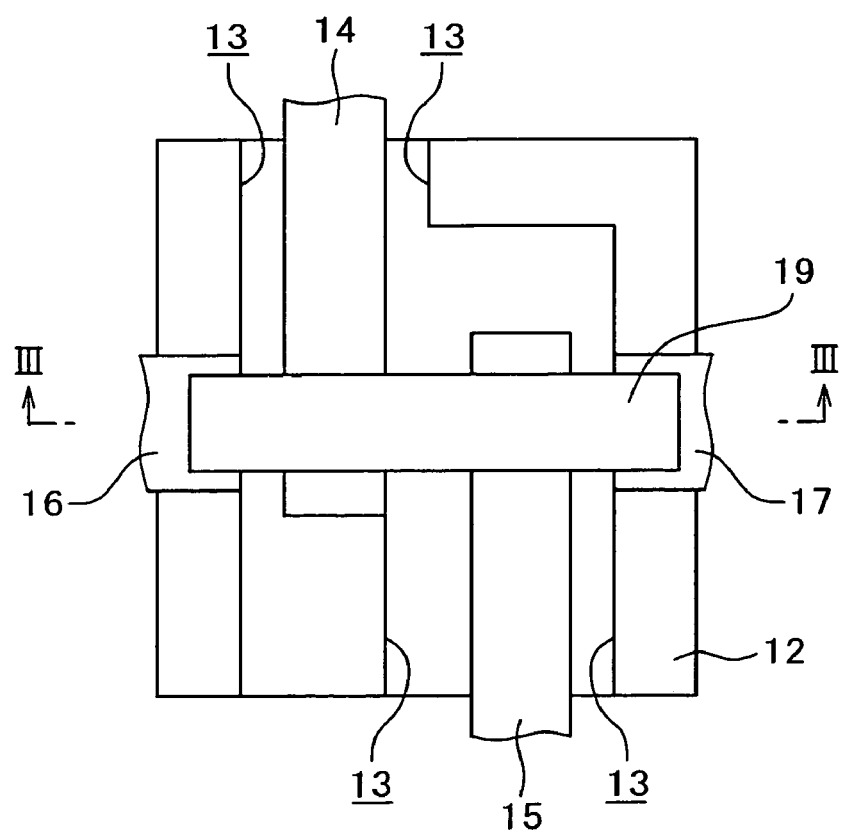

As shown in FIGS. 3A and 3B, the insulating layer 12 is formed on the substrate 11. The substrate 11 is a semiconductor substrate, for which a silicon substrate or compound semiconductor substrate, for example, can be used. The insulating layer 12 herein is formed typically using a silicon nitride film, where it is also allowable to adopt a stacked structure of a silicon oxide film and a silicon nitride film, or a silicon oxide film depending on materials composing sacrificial layers described later in relation to the fabrication method. The insulating layer 12 has the groove 13 formed therein. The groove 13 is formed in the insulating layer 12 so as to extend around the side edges of the first electrode 14 and the second electrode 15 as described later.

The first electrode 14 for signal input (typically a signal input of a predetermined frequency, such as high-frequency signal input) is formed on the insulating layer 12 on one side of the groove 13, and the second electrode 15 for signal output (typically a signal output of a predetermined frequency, such as high-frequency signal output) is formed on the insulating layer 12 on the other side of the groove 13 so as to be spaced from the first electrode 14. The groove 13 herein is formed so as to get under side edges of the first electrode 14 and the second electrode 15. It is also allowable that the groove 13 is formed so as to get under the side edges of the first electrode 14 and the side edges of the second electrode 15. Further on the insulating layer 12, the wiring portion 16 of the oscillator electrode is formed so as to oppose with the first electrode 14 while being spaced by the groove 13 opposite to the second electrode 15, and the wiring portion 17 of the oscillator electrode is formed so as to oppose with the second electrode 15 while being spaced by the groove 13 opposite to the first electrode 14.

The oscillator electrode 19 which is electrically connected with the wiring portions 16, 17 is formed as extending over the first electrode 14 and the second electrode 15, while being opposed thereto and spaced therefrom by the air gap 18. The air gap 18 spacing the first electrode 14 and the second electrode 15 from the oscillator electrode 19 is formed to a thickness of 10 nm to 100 nm, for example.

Because the groove 13 is formed in the insulating layer 12 so as to extend around the side edges of the first electrode 14 and the second electrode 15, the micromachine 3 of the third embodiment is more successful in reducing the capacitance between the first electrode 14 and the second electrode 15 as compared with the configuration of the first embodiment, and consequently in obtaining a large S/N ratio even under high-frequency operation. Simulation study by the present inventor has revealed that the configuration of the first embodiment was successful in reducing the capacitance (DC) by as much as 39% as compared with a configuration having no groove 13 formed therein.

Operations of the micromachine 3 of the third embodiment are similar to those of the micromachine 1 described in the first embodiment.

Next, a modified example of the micromachine according to the third embodiment of the present invention will be explained referring to a plan view shown in FIG. 4.

Figure 4:
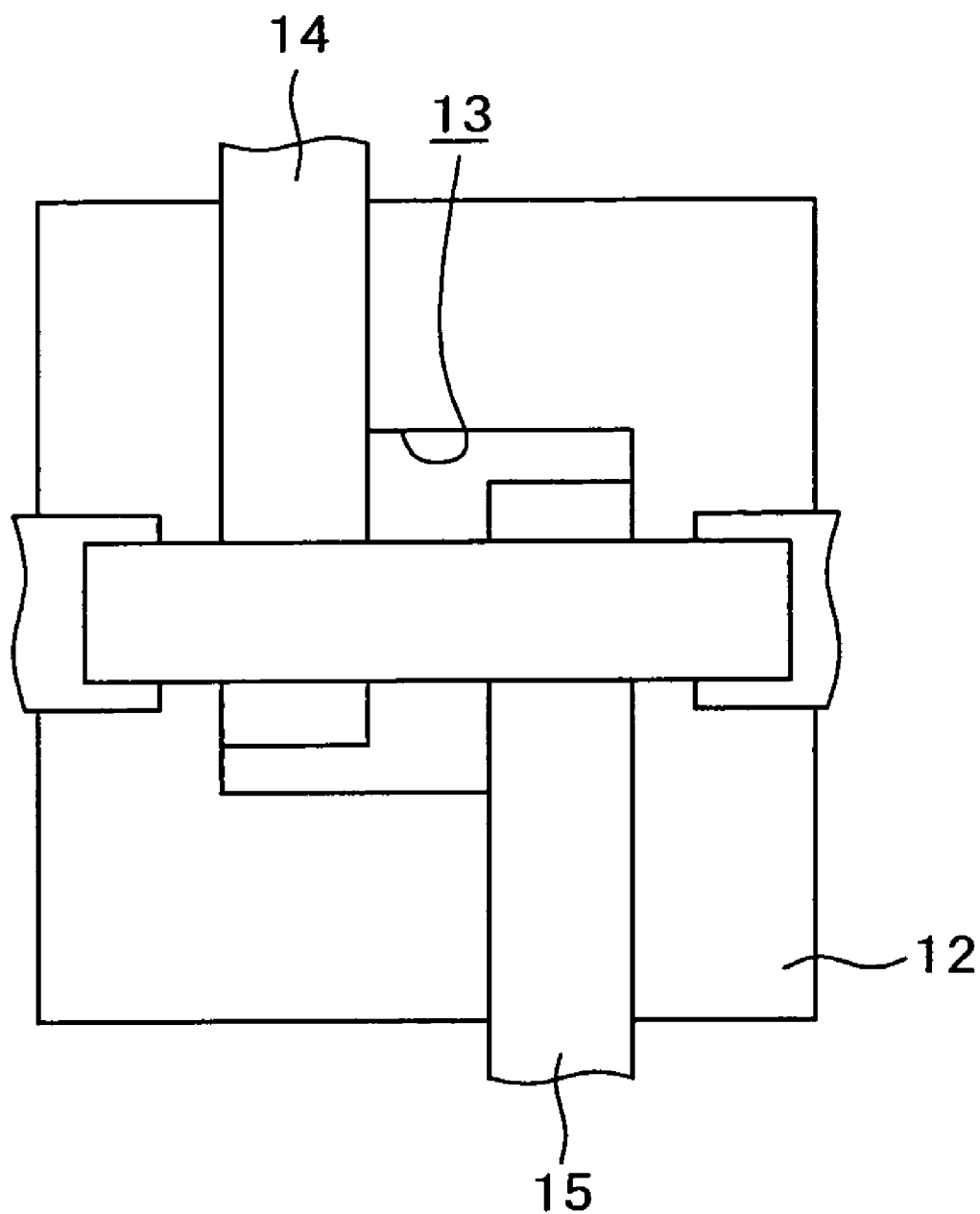
FIG. 4 is a plan view showing a modified example of a micromachine according to the third embodiment of the present invention.

As shown in FIG. 4, it is also allowable to form the first groove 13 around a part of the side edges of the first electrode 14 and around a part of the side edges of the second electrode 15. In this example, the groove 13 is formed in the insulating layer 12 between the first electrode 14 and the second electrode 15, and so as to extend towards the direction of the edges of the first electrode 14 and the second electrode 15.

Also the micromachine 4 of the above-described modified example of the third embodiment is successful in further reducing the capacitance between the first electrode 14 and the second electrode 15 as compared with the configuration of the first embodiment, and consequently in obtaining a large S/N ratio even under high-frequency operation.

Operations of the micromachine 4 of the modified example of the third embodiment are similar to those of the micromachine 1 described in the first embodiment.

Next, a method of fabricating a micromachine according to the first embodiment of the present invention will be described referring to sectional views of FIGS. 5A to 5H for explaining process steps for the fabrication.

Figure 5A:
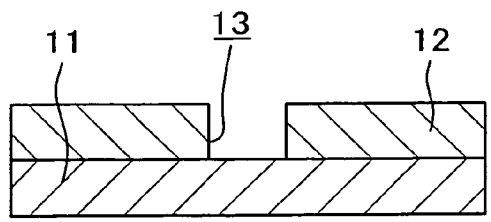
FIGS. 5A to 5H are schematic sectional views showing process steps of a method of fabricating a micromachine according to a first embodiment of the present invention.

As shown in FIG. 5A, the insulating layer 12 is formed on the substrate 11, and the groove 13 is formed in the insulating layer 12. The substrate 11 is a semiconductor substrate, for which a silicon substrate or compound semiconductor substrate, for example, can be used. The insulating layer 12 is formed typically using a silicon oxide film or a silicon nitride film, or a stacked film of these, where a silicon nitride film was used herein. The insulating layer 12 can typically be formed by the LPCVD (Low Pressure CVD) process. The groove 13 is formed by forming a resist film (not shown) on the insulating layer 12, an opening for forming the groove 13 is formed in the resist film by a photolithographic technique, and the insulating layer 12 is etched under masking by the resist film. The resist film is removed thereafter.

In an exemplary process in which the insulating layer 12 is formed using a stacked film, first the surface of the substrate (silicon substrate, for example) 11 is thermally oxidized to thereby form a silicon oxide film. The silicon oxide film herein is formed in order to relax stress possibly exerted on the substrate 11 by a silicon nitride film formed later. Next the silicon nitride film is formed by the LPCVD process.

Figure 5B:
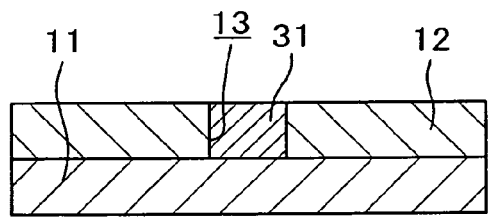

Next, as shown in FIG. 5B, a first sacrificial layer 31 is formed so as to fill the groove 13. The first sacrificial layer 31 is necessarily formed using a film having an etching selectivity against the insulating layer 12, and is typically formed using a silicon oxide film for the insulating layer 12 composed of silicon nitride, and using a silicon nitride film for the insulating layer 12 composed of silicon oxide.

In an exemplary case where the first sacrificial layer 31 is formed using a silicon oxide film, a hot-wall-type CVD apparatus can be used. Reaction gases typically used herein are silane (e.g., monosilane ($SiH_4$)) gas and nitrogen monoxide ($N_2O$) gas, where a flow rate thereof are typically adjusted to 50 cm³/min and 1000 cm³/min, respectively. Although a high-temperature oxide (HTO) film formed in the hot-wall-type CVD apparatus was used herein in consideration of the step coverage and denseness of the film, it is also allowable to use any other oxide films obtained by using TEOS gas, or any glass films composed of NSG, PSG, BSG, BPSG and so forth.

An excessive portion of the first sacrificial layer 31 on the insulting layer 12 is then removed. The removal can typically be carried out by CMP or etchback. It is particularly preferable to planarize a surface of the insulating layer 12 (including the first sacrificial layer 31) by CMP. Conditions for CMP are typically adjusted to a head load of 30 kPa and a number of rotations of as slow as 23 rpm. Pre-treatment and post-treatment before and after CMP were carried out using a dilute hydrofluoric acid (DHF).

Next, an electrode-making film (not shown) for making the electrodes is formed. The electrode-making film is formed using a polysilicon film containing some impurity for obtaining electro-conductivity. The impurity available herein is an n-type impurity such as phosphorus, arsenic, antimony or the like. Phosphorus was used herein, so as to produce phosphorus-doped polysilicon. Method of forming the phosphorus-doped polysilicon was the CVD process generally used for forming polysilicon using phosphine ($PH_3$) as an impurity gas.

It is preferable to carry out thermal oxidation and annealing thereafter to thereby allow the impurity phosphorus atoms reside in a crystal boundary of the phosphorus-doped polysilicon film to diffuse into the grains, to thereby activate the impurity and lower the resistivity. The thermal oxidation was carried out typically under an oxygen atmosphere at 1,000° C. for 12 minutes, and the annealing was carried out typically under a nitrogen atmosphere at 1,000° C. for 6 minutes.

Figure 5C:
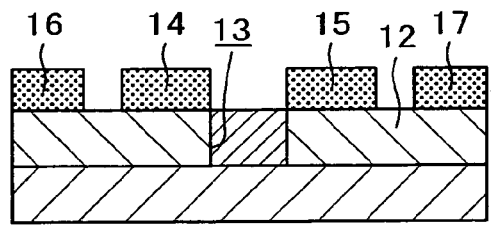

A resist film (not shown) was then formed on a electrode-making film; the resist film was patterned by a lithographic technique to thereby form geometry of the first electrode, the second electrode and the wiring portion of the oscillator electrode; and the electrode-making film was etched under masking by the resist film to thereby form, as shown in FIG. 5C, the first electrode 14 which serves as an input electrode on one side of the groove 13 on the insulating layer 12, the second electrode 15 which serves as an output electrode on the other side of the groove 13 on the insulating layer 12, and the wiring portions 16, 17 of the oscillator electrode on the insulating layer 12 are formed as being opposed with the groove 13 while placing the first electrode 14 and the second electrode 15 in between, and while being spaced from the first electrode 14 and the second electrode 15.

Figure 5D:
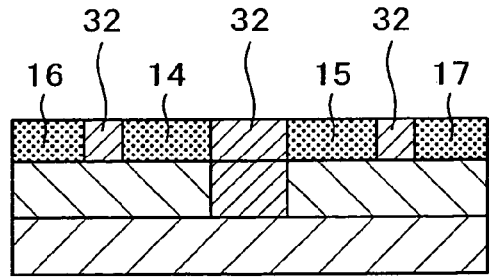

Next, as shown in FIG. 5D, a space individually between the first electrode 14, the second electrode 15 and the wiring portions 16, 17 are filled with a second sacrificial layer 32. The second sacrificial layer 32 used herein is a film similar to that used for the first sacrificial layer 31. Method of forming the second sacrificial layer 32 may be similar to that for forming the first sacrificial layer 31, or may differ therefrom. The excessive portion of the second sacrificial layer 32 on the individual electrodes is then removed so as to expose the individual surfaces of the first electrode 14, the second electrode 15 and the wiring portions 16, 17. The removal can be carried out by CMP or etchback. It is preferable to planarize the surface of the first sacrificial layer 31 (including the first electrode 14, the second electrode 15 and wiring portions 16, 17).

Figure 5E:
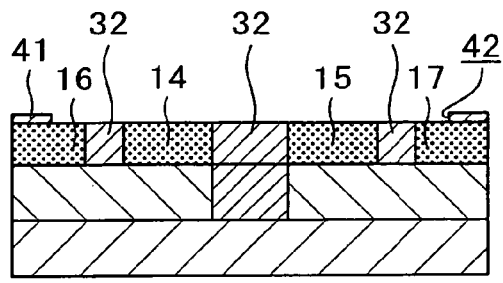

Next, as shown in FIG. 5E, a mask 41 is formed on the second sacrificial layer 32 (including the first electrode 14, the second electrode 15 and the wiring portions 16, 17). The mask 41 herein is formed using a silicon nitride film. It is to be noted that the mask 41 is formed using a silicon oxide film for a case where the first and second sacrificial layers 31, 32 are formed using a silicon nitride film. The silicon nitride film is then patterned based on a general lithographic technique using a resist film and based on an etching technique, to thereby form an opening 42 in which surfaces of the first electrode 14, the second electrode 15 and parts of the individual wiring portions 16, 17 are exposed. The resist film is then removed.

Figure 5F:
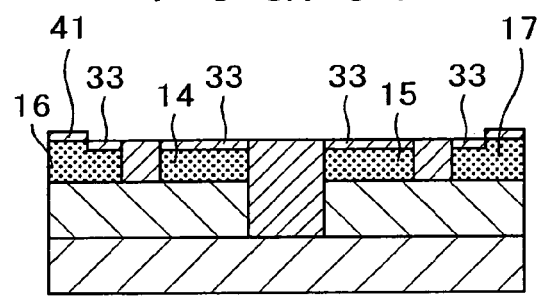

Next, as shown in FIG. 5F, oxidation under masking with the mask 41 is carried out, to thereby form a third sacrificial layer 33 composed of a silicon oxide film on the surfaces of the first electrode 14, the second electrode 15 and parts of the individual wiring portions 16, 17. Method of forming the silicon oxide film was typically a thermal oxidation method, which was actually carried out under an oxygen atmosphere at 1,000° C. for 12 minutes. For a case where the mask 41 is formed using a silicon oxide film, the first and second sacrificial layers 31, 32 are formed using a silicon nitride film, so that the third sacrificial layer 33 composed of silicon nitride is formed by nitrification on the surfaces of the first electrode 14, the second electrode 15 and parts of the individual wiring portions 16, 17. The third sacrificial layer 33 is formed typically to a thickness of 10 nm to 100 nm on the first electrode 14 and the second electrode 15.

Next, although not shown, a resist mask having openings on the wiring portions 16, 17 is formed by a general lithographic technique, and the third sacrificial layer 33 was selectively removed on the wiring portions 16, 17 by etching under masking by the resist mask. The resist mask is then removed.

Figure 5G:
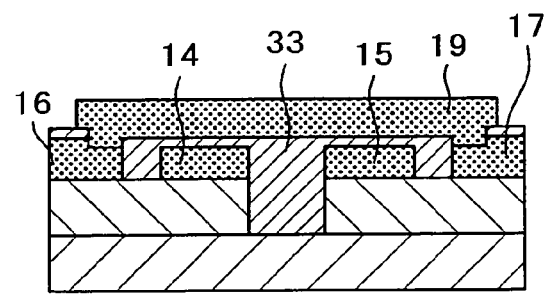

Next, an electrode-making film (not shown) for making the oscillator electrode is formed. The electrode-making film is carried out using a polysilicon film containing some impurity for obtaining electro-conductivity. The impurity available herein is an n-type impurity such as phosphorus, arsenic, antimony or the like. Phosphorus was used herein, so as to produce phosphorus-doped polysilicon. Formation of the electrode-making film can be formed similarly to the method of forming the electrode-making film for forming the first and second electrodes 14, 15 and so forth. A resist film (not shown) is then formed on the electrode-making film, the resist film is patterned by a lithographic technique to thereby form a geometry of the oscillator electrode, and the electrode-making film is etched (typically by dry etching) under masking with thus-patterned resist film to thereby form, as shown in FIG. 5G, the oscillator electrode 19 electrically connected with the wiring portions 16, 17 as extending over the first electrode 14 and the second electrode 15 while placing the third sacrificial layer 33 thereunder.

Figure 5H:
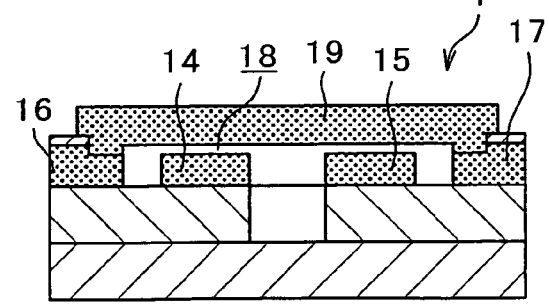
Figure 6:
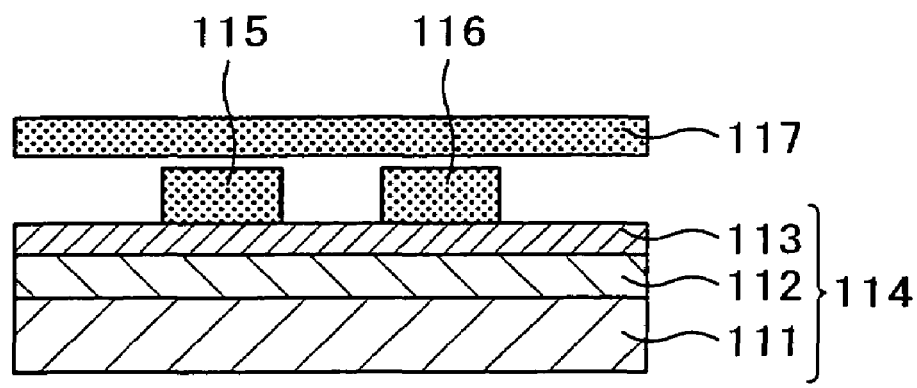
FIG. 6 is a schematic sectional view showing a configuration of a related art oscillator.
Figure 7:
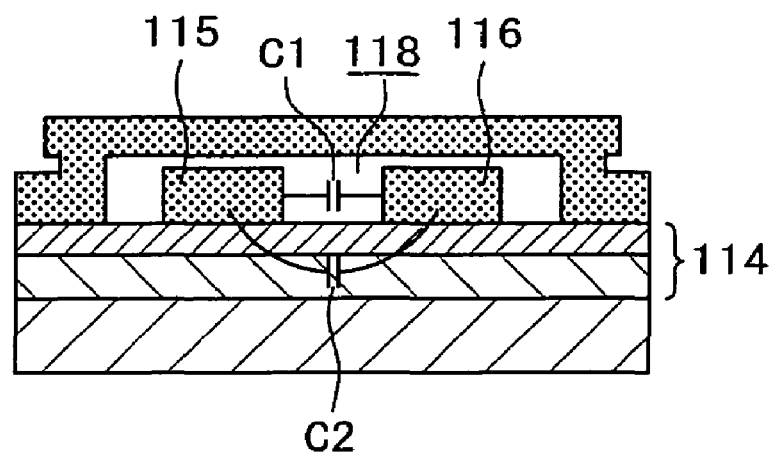
FIG. 7 is a schematic sectional view for explaining problems in a configuration of a related art oscillator.

Next, the first, second and third sacrificial layers 31, 32, 33 are selectively removed. In a case where the first, second and third sacrificial layers 31, 32, 33 are formed using silicon oxide films, the removal can be carried out by wet etching using an etching solution capable of selectively removing silicon oxide without affecting polysilicon and silicon nitride. The etching solution used herein was a buffered hydrofluoric acid (BHF) (50:1 mixture of HF (1.0 wt %) and NH$_4$F (39.2 wt %)) solution. For a case where the first, second and third sacrificial layers 31, 32, 33 are formed using silicon nitride films, they are removed by wet etching using an etching solution capable of selectively removing silicon nitride without affecting polysilicon and silicon oxide (e.g., hot phosphoric acid solution). By these procedures, as shown in FIG. 5H, the groove 13 is formed in the insulating layer 12 between the first electrode 14 and the second electrode 15, and over the first electrode 14 and the second electrode 15, the oscillator electrode 19 connected to the wiring portions 16, 17 is formed while being opposed therewith and being spaced therefrom by the air gap 18.

Because the groove 13 is formed in the insulating layer 12 between the first electrode 14 and the second electrode 15, the method of fabricating a micromachine of the first embodiment is successful in reducing the capacitance between the first electrode 14 and the second electrode 15, and consequently in obtaining a large S/N ratio even under high-frequency operation.

Next, the method of fabricating a micromachine according to a second embodiment of the present invention will be explained referring to FIGS. 2A and 2B.

The second embodiment is a fabrication method characterized by having, after the removal of the first sacrificial layer 31, the second sacrificial layer 32 and the third sacrificial layer 33 as described in the first embodiment explained referring to FIGS. 5A to 5H, the insulating layer 12 is etched in the groove 13 at portions under the side edges of the first electrode 14 and the second electrode 15 so as to allow the groove 13 to get under the first electrode 14 and the second electrode 15. The etching in this process step can be carried out by wet etching using a hot phosphoric acid solution as an etching solution for a case where the insulating layer 12 is composed of a silicon nitride film, and using a buffered hydrofluoric acid solution as an etching solution for a case where the insulating layer 12 is composed of a silicon oxide film. That is, an etching solution capable of selectively etching the insulating layer 12 without affecting the first and second electrodes 14, 15, the oscillating electrode 19 and the wiring portions 16, 17 is used.

Next, a method of fabricating a micromachine according to the third embodiment of the present invention will be described again referring to FIGS. 3A and 3B.

The third embodiment can be accomplished by forming the groove 13 so as to extend around the sides edges of the first electrode 14 and the second electrode 15, in the process step of forming the groove 13 in the first embodiment as previously described referring to FIGS. 5A to 5H. Other process steps are similar to those in the first embodiment.

It is also allowable, as shown in FIG. 4, to form the groove in the insulating layer 12 around a part of the side edges of the first electrode 14 and around a part of the side edges of the second electrode 15. In this example, the groove 13 is formed in the insulating layer 12 between the first electrode 14 and the second electrode 15, and so as to extend towards the direction of the edges of the first electrode 14 and the second electrode 15.

Also the fabrication methods according to the second and third embodiments are successful in reducing capacitance between the first electrode 14 and the second electrode 15, similarly to the fabrication method according to the first embodiment.

The invention claimed is:

1. A micromachine comprising:
   an insulating layer formed on a substrate;
   a first electrode for signal input formed on said insulating layer;
   a second electrode for signal output formed on said insulating layer; and
   an oscillator electrode formed as being opposed with said first electrode and said second electrode while being spaced therefrom by an air gap,
   wherein
   said insulating layer has a groove formed therein at least between said first electrode and said second electrode.

2. The micromachine as claimed in claim 1, wherein said groove is formed so as to get under side edges of said first electrode and said second electrode.

3. The micromachine as claimed in claim 1, wherein said groove is formed so as to extend around side edges of said first electrode and said second electrode.

* * * * *